United States Patent
Yang et al.

(10) Patent No.: US 11,183,404 B2
(45) Date of Patent: Nov. 23, 2021

(54) DIFFUSER AND SEMICONDUCTOR PROCESSING SYSTEM USING SAME

(71) Applicant: TAIWAN SEMICONDUCTOR MANUFACTURING COMPANY LTD., Hsinchu (TW)

(72) Inventors: Sheng-chun Yang, Hsinchu (TW); Yi-Ming Lin, Tainan (TW); Chao-Hung Wan, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 124 days.

(21) Appl. No.: 16/395,666

(22) Filed: Apr. 26, 2019

(65) Prior Publication Data
US 2020/0135513 A1    Apr. 30, 2020

Related U.S. Application Data

(60) Provisional application No. 62/753,338, filed on Oct. 31, 2018.

(51) Int. Cl.
*B05B 1/00* (2006.01)
*C23C 16/455* (2006.01)
(Continued)

(52) U.S. Cl.
CPC ........ *H01L 21/67196* (2013.01); *B05B 1/005* (2013.01); *B05B 1/14* (2013.01);
(Continued)

(58) Field of Classification Search
CPC ......... H01L 21/67196; H01L 21/67017; H01L 21/67742; C23C 16/4408;
(Continued)

(56) References Cited

U.S. PATENT DOCUMENTS 5,908,662 A * 6/1999 Fu ................... C23C 16/4412
118/715
6,119,368 A * 9/2000 Masterson ........ H01L 21/67017
34/404
(Continued)

FOREIGN PATENT DOCUMENTS

TW        201216337        4/2012

OTHER PUBLICATIONS

Office Action dated Nov. 6, 2020 for corresponding case No. TW 10921077870. (pp. 1-8).

*Primary Examiner* — Jessica Cahill
*Assistant Examiner* — Patrick C Williams
(74) *Attorney, Agent, or Firm* — Hauptman Ham, LLP

(57) ABSTRACT

A diffuser for diffusing a gas includes a base portion and a head portion fluidly coupled to the base portion. The head portion includes a diffuser element configured to diffuse a first fraction of the gas through a circumference of the diffuser element and a second fraction of the gas through an end surface of the diffuser element. The head portion further includes a connecting structure having a first connecting portion configured to receive a portion of the diffuser element therein and a second connecting portion protruding outwardly from the first connecting portion and configured to couple to the base portion.

17 Claims, 7 Drawing Sheets

(51) Int. Cl.
*C23C 16/44* (2006.01)
*H01L 21/67* (2006.01)
*H01L 21/677* (2006.01)
*B05B 1/14* (2006.01)
*G05D 7/06* (2006.01)

(52) U.S. Cl.
CPC ...... *C23C 16/4402* (2013.01); *C23C 16/4408* (2013.01); *C23C 16/45559* (2013.01); *C23C 16/45561* (2013.01); *H01L 21/67017* (2013.01); *G05D 7/0676* (2013.01); *H01L 21/67742* (2013.01)

(58) Field of Classification Search
CPC .......... C23C 16/45559; C23C 16/4402; C23C 16/45561; B05B 1/14; B05B 1/005; G05D 7/0676
See application file for complete search history.

(56) References Cited

U.S. PATENT DOCUMENTS

| | | | | |
|---|---|---|---|---|
| 6,323,463 B1* | 11/2001 | Davis | ................... | C23C 14/566 |
| | | | | 118/724 |
| 8,833,733 B2* | 9/2014 | Bogert | ................... | F16L 19/10 |
| | | | | 251/148 |
| 2006/0065194 A1* | 3/2006 | Ham | ................ | H01L 21/67167 |
| | | | | 118/715 |
| 2008/0152838 A1 | 6/2008 | Sen et al. | | |
| 2017/0356085 A1 | 12/2017 | Morey | | |
| 2018/0185893 A1* | 7/2018 | Vincent | ............. | H01L 21/67017 |

* cited by examiner

600

```
┌─────────────────────────────────────────────────────────────┐
│ Providing a semiconductor processing system comprising      │
│ a transfer chamber and processing chambers,                 │──602
│ the transfer chamber containing a plurality of gas inlet ports.│
│ A plurality of diffusers is received in the plurality of gas inlets.│
└─────────────────────────────────────────────────────────────┘
                              │
                              ▼
┌─────────────────────────────────────────────────────────────┐
│ Transferring substrates into the transfer chamber           │──604
└─────────────────────────────────────────────────────────────┘
                              │
                              ▼
┌─────────────────────────────────────────────────────────────┐
│ Purging the transfer chamber by inflow of a purge gas through│──606
│ the plurality of diffusers                                  │
└─────────────────────────────────────────────────────────────┘
                              │
                              ▼
┌─────────────────────────────────────────────────────────────┐
│ Opening slit valves between the transfer chamber and        │──608
│ the processing chambers                                     │
└─────────────────────────────────────────────────────────────┘
                              │
                              ▼
┌─────────────────────────────────────────────────────────────┐
│ Transferring the substrates into the processing chambers    │──610
└─────────────────────────────────────────────────────────────┘
                              │
                              ▼
┌─────────────────────────────────────────────────────────────┐
│ Closing slit valves and stopping the gas flowing into       │──612
│ the transfer chamber                                        │
└─────────────────────────────────────────────────────────────┘
```

DIFFUSER AND SEMICONDUCTOR PROCESSING SYSTEM USING SAME

BACKGROUND

Semiconductor devices include metal lines that are insulated from each other by dielectric layers. As the dimensions of integrated circuits continue to shrink and circuit operating frequency keeps increasing, both signal delays due to capacitive coupling and crosstalk between closely spaced metal lines are increasing. These situations are exacerbated as metal lines become shorter in order to minimize transmission delays. To help address these situations, insulating materials having relatively low dielectric constants (referred to as low-k dielectrics) are being used in place of silicon dioxide (and other materials that have relatively high dielectric constants) to form the dielectric layer that separates the metal lines.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a flow chart of a method of controlling a gas flow distribution profile in a transfer chamber, in accordance with some embodiments.

DETAILED DESCRIPTION

Figure 1:
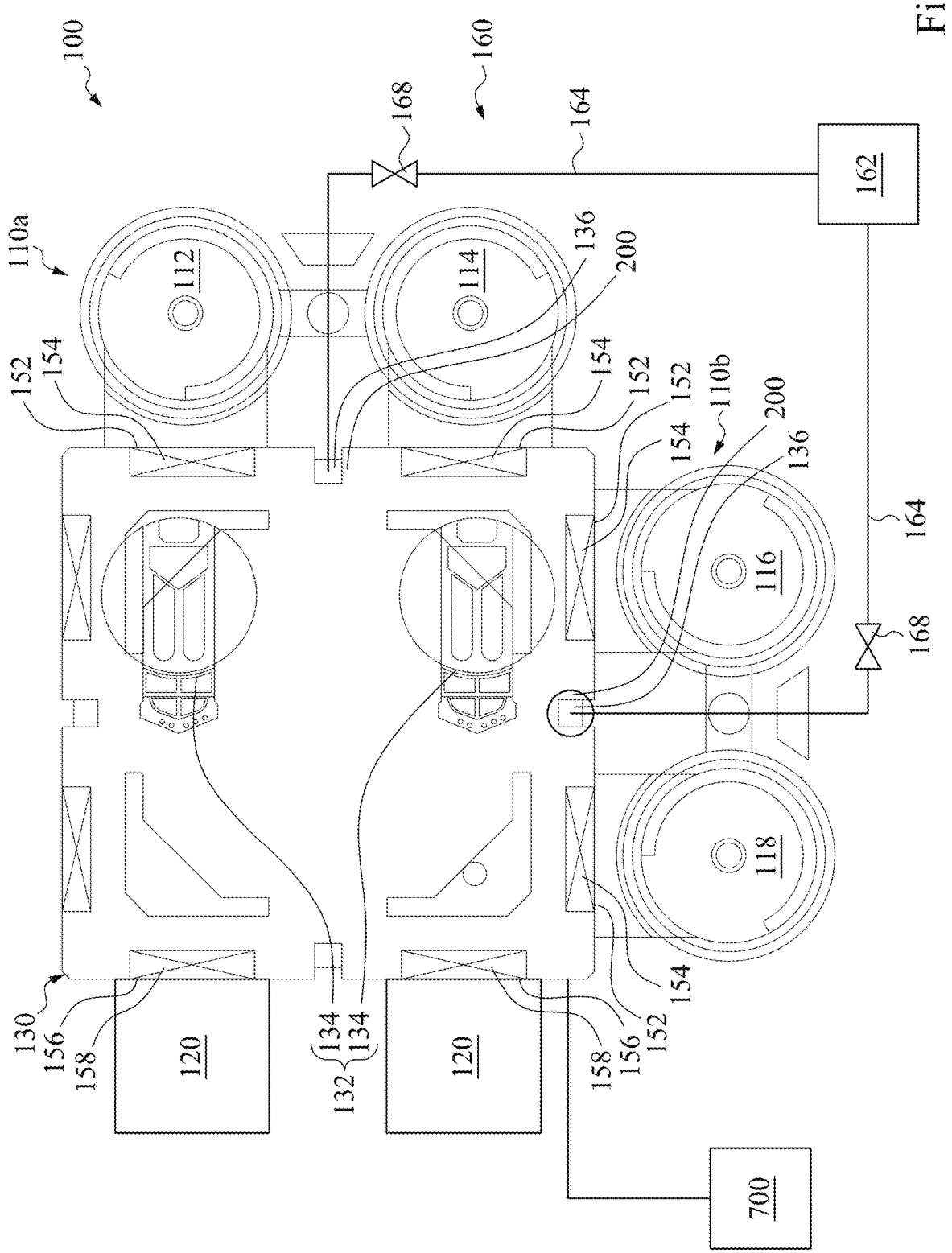
FIG. 1 is a plan view of a semiconductor processing system, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. System may be otherwise oriented (rotated 90 degrees or at other orientations) and the spatially relative descriptors used herein may likewise be interpreted accordingly.

To reduce the dielectric constant of insulating materials, porous organosilicate low-k dielectrics, such as SiCOH, are formed. In some instances, a porous organosilicate low-k dielectric film is formed by co-depositing a dielectric matrix forming material, for example a SiCOH precursor, and a sacrificial pore forming agent (i.e., porogen) onto a substrate to form a porogen containing precursor film. After deposition, porogen is removed from the precursor film, thereby leaving pores in the resulting low-k dielectric film.

Chemical vapor deposition (CVD) is routinely utilized to deposit porogen containing dielectric films. In some instances, the CVD process that forms porogen containing dielectric films and the subsequent curing process that removes the porogen are performed in a multi-chamber processing system (e.g., a cluster tool) which has the capability to process substrates (e.g., semiconductor wafers) in a controlled processing environment. A multi-chamber processing system includes a central transfer chamber surrounded by a number of processing chambers within which various semiconductor fabrication processes are carried out on the substrates (e.g., deposition, etching, doping, annealing, and oxidizing). A robot is provided in the transfer chamber for moving the substrates within the multi-chamber processing system. The transfer chamber is isolated from each of the individual processing chambers by a slit valve. The slit valves, when opened, allow the robot to transfer the substrates between the transfer chamber and the processing chambers. In some instances, the CVD deposition of porogen containing dielectric materials is conducted at a temperature ranging from about 300° C. to about 400° C.

Because porogens are removed in the form of volatile hydrocarbons, formation of porous low-dielectric films leaves porogen residues on exposed surfaces of the processing chambers, including surfaces of processing chamber components and surfaces of slit valves. These porogen residues become a source of particulate defects on subsequently processed substrates.

To help prevent particulate contamination of the transfer chamber during the substrate transfer, a pressure differential is created between the transfer chamber and the processing chamber to be accessed prior to opening the slit valve therebetween, such that the internal pressure of the processing chamber is lower than the internal pressure of the transfer chamber. Normally, the transfer chamber is supplied with a purge gas (the purge gas is an inert gas such as nitrogen, in at least some embodiments) to maintain the internal pressure of the transfer chamber above that of the processing chamber. Thus, when the slit valve is opened for substrate transfer, the purge gas flows from the transfer chamber into the processing chamber due to the pressure differential, thereby helping to prevent particles in the processing chamber from entering the transfer chamber. As a result, contamination of the transfer chamber by the porogen residues in the processing chamber is suppressed.

However, as the purge gas flows into the processing chamber via a passage between the transfer chamber and a corresponding processing chamber, a vortex flow pattern is produced at the passage. The vortex flow pattern agitates and stirs up particles adhered to the surfaces of the slit valve and the corresponding processing chamber, and as the substrate to be processed passes through the passage, a risk that some of the floating particles deposit on, and contaminate, the active surface of the substrate increases. Even more, after the particles are deposited on the substrate, the deposited particles are difficult to remove using the purge gas. The particulate contamination is particularly problematic for the porous low-k dielectrics, because the particulate contamination normally causes the dielectric to break down under bias and at low-electric fields. As the dimensions of devices continue to decrease, tolerance for an amount and/or size of particles introduced during the fabrication process decreases.

A diffuser, when installed in a transfer chamber of a semiconductor processing system, helps to provide a more uniform gas flow in the transfer chamber. The uniform gas flow helps to suppress the vortex formation at the passage when a substrate is transferred between the transfer chamber and the processing chamber which, in turn, helps to reduce the number of particles stirred up during the substrate transfer. As a result, defects in the final devices caused by particles deposited due to the vortex flow is eliminated or reduced. In addition, the diffuser raises the pressure in the transfer chamber in a more uniform manner than not having the diffuser. The increased pressure difference between the transfer chamber and the processing chamber forces the floating particles into the processing chamber, thereby helping to reduce the chances of substrate contamination by the floating particles. Furthermore, the substrate is heated during the CVD deposition process. The uniform gas flow also helps to produce a more uniform cooling of the heated substrate, thus helping to reduce the thermal stress in the substrate that is induced by the localized cooling of the substrate as the heated substrate passes the passage at the boundary of the transfer chamber and the processing chamber. The reduced thermal stress helps to decrease the likelihood of cracking of the substrate during future processing or use.

FIG. 1 is a plan view of a semiconductor processing system 100, in accordance with some embodiments.

Referring to FIG. 1, the semiconductor processing system 100 includes a plurality of processing chambers 112, 114, 116, 118 and one or more load lock chambers 120 (two shown) that are coupled to a transfer chamber 130. Although four processing chambers and two load lock chambers are included in FIG. 1, any number of processing chambers, e.g., more or less than four processing chambers, and any number of load lock chambers, e.g., more or less than two load lock chambers, are contemplated in the embodiments described herein.

The processing chambers 112, 114, 116, 118 are configured to performance various processes including, but not limited to, CVD, plasma-enhanced chemical vapor deposition (PECVD), physical vapor deposition (PVD), atomic layer deposition (ALD), curing, and annealing. In some embodiments, at least one of the processing chambers 112, 114, 116, 118 is used as a CVD chamber for depositing a dielectric film, such as a low-k dielectric film on a substrate. In some embodiments, the substrate is a semiconductor wafer, a glass plate or panel, and/or other workpiece used to make electronic devices or circuit components.

Figure 7:
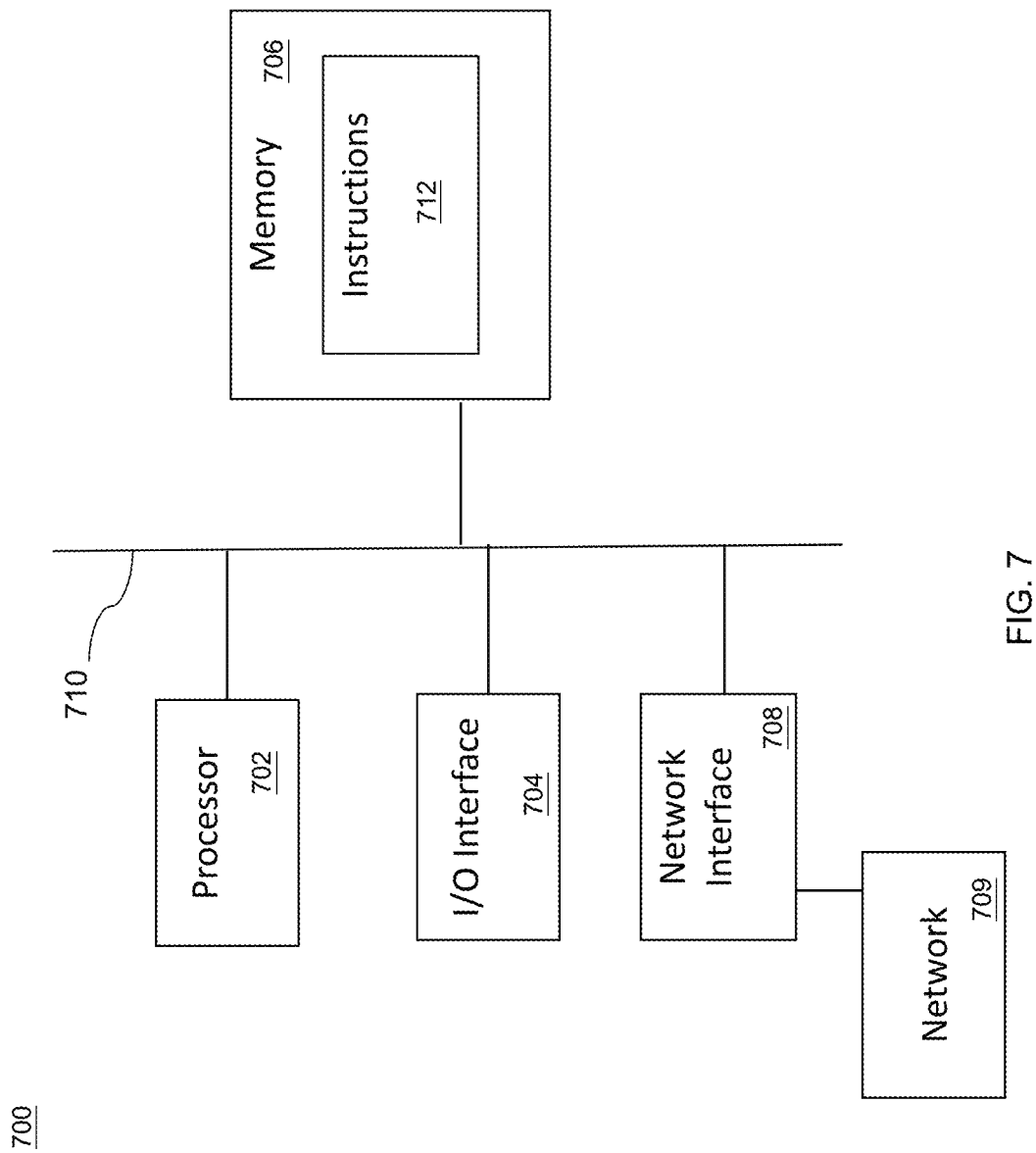
FIG. 7 is a schematic diagram of a controller system, in accordance with one or more embodiments.

In some embodiments, for example, as in FIG. 1, the processing chambers 112, 114, 116, 118 are grouped in pairs with each of the processing chambers 112 and 114, and 116 and 118 in each pair positioned adjacent to one another. In some embodiments, each pair of processing chambers 112 and 114, and 116 and 118 is part of a tandem processing chamber 110a, 110b where each pair of processing chambers 112 and 114, and 116 and 118 is located in a common housing provided with shared processing resources. In some embodiments, processing chambers 112 and 114, and 116 and 118 in corresponding tandem processing chambers 110a, 110b share a common process gas supply, a common pressure control, and a common process gas exhaust/pumping system. One of ordinary skill in the art would understand the arrangement and combination of processing chambers are allowed to be altered for purposes of performing specific processing steps. In some embodiments, a first pair of the processing chambers 112 and 114, or processing chambers 116 and 118, is configured to deposit low-k dielectric films on substrates, and a second pair of the processing chambers 112 and 114, or processing chambers 116 and 118, is configured to anneal the deposited low-k dielectric films. In some embodiments, each pair of the processing chambers 112 and 114, and processing chambers 116 and 118, is configured to both deposit and anneal low-k dielectric films on substrates. The operation of the processing chambers 112, 114, 116, and 118 is controlled by a controller system such as controller system 700 (FIG. 7).

The load lock chambers 120 are adapted to interface with a factory interface (not shown). The factory interface is configured to receive substrates from substrate carriers, such as front opening unified pods (FOUPs). The load lock chambers 120 are adapted to transfer the substrates into and/or out of the transfer chamber 130. The load lock chambers 120 are pre-vacuum chambers for temporarily holding the substrates from the factory interface or the substrates from the transfer chamber 130. The load lock chambers 120 are evacuated by a vacuum pump to help prevent contaminants from the factory from entering the transfer chamber 130.

Openings 152 are provided at the boundaries between the transfer chamber 130 and each of the processing chambers 112, 114, 116, and 118. Through each opening 152, the substrate is transferred between the transfer chamber 130 and each of the processing chambers 112, 112, 116, and 118. Each opening 152 is selectively sealed via a slit valve 154. Each slit valve 154 is configured to be opened to allow the transfer of a substrate between the transfer chamber 130 and a corresponding processing chamber 112, 114, 116, or 118.

Similarly, openings 156 are provided at the boundaries between the transfer chamber 130 and each of the load lock chambers 120. Through each opening 156, the substrate is transferred between the transfer chamber 130 and each of the load lock chambers 120. Each opening 156 is selectively sealed via a slit valve 158. Each slit valve 158 is configured to be opened to allow the transfer of a substrate between the transfer chamber 130 and a corresponding load lock chamber 120.

The transfer chamber 130 is configured to allow transferring the substrates between the processing chambers 112, 114, 116, 118 or between the processing chambers 112, 114, 116, and 118 and load lock chambers 120 via the transfer chamber 130 without exposing the substrates to ambient atmosphere. The transfer chamber 130 houses a transfer robot 132. In some embodiments, the transfer robot 132 includes two transfer blades 134 configured to simultaneously transfer two substrates to processing chambers 112, 114, 116, and 118 in each pair of processing chambers 112 and 114, and 116 and 118. In some embodiments, the robot blades 134 are arranged in parallel. In some embodiments, the transfer robot 132 includes a single robot blade configured to transfer substrates to processing chambers 112, 114, 116, and 118 one by one.

A plurality of gas inlet port 136 is provided through a wall 138 (FIG. 2) of the transfer chamber 130 for introducing a purge gas into the transfer chamber 130. In some embodiments, each gas inlet port 136 is located between adjacent slit valves 154 of corresponding pairs of processing chambers 112 and 114, 116 and 118. Each gas inlet port 136 has an end adapted to connect to a gas supply system 160. The gas supply system 160 is adapted to supply the purge gas to the transfer chamber 130. In some embodiments, the gas supply system 160 includes a gas supply source 162 and gas supply lines 164 through which the purge gas is supplied from the gas supply source 162 to the corresponding gas inlet ports 136. Valves 168 are disposed on corresponding gas supply lines 164 and are adapted to adjust a flow rate of the purge gas. The purge gas includes an inert gas such as, for example, argon, helium, or nitrogen. In some embodiments, nitrogen is used as the purge gas.

The transfer chamber 130 and the processing chambers 112, 114, 116 and 118 are each maintained under vacuum by a vacuum pump (not shown) during processing. The transfer chamber 130 is maintained at a low vacuum state when substrates are transferred by the transfer robot 132 into processing chambers 112, 114, 116, and 118. To minimize particle contaminants during the transfer of the substrates between the transfer chamber 130 and the processing chambers 112, 114, 116, and 118, the transfer chamber 130 is provided with a positive pressure differential between the transfer chamber 110 and the processing chambers 112, 114, 116, and 118. A positive pressure differential means that the interior pressure of the transfer chamber 110 is higher than the interior pressure of the processing chambers 112, 114, 116, and 118. The transfer chamber 130 is supplied with a purge gas via the gas inlet ports 136 to maintain the interior pressure of the transfer chamber 130 above the interior pressure of the processing chambers 112, 114, 116, and 118.

To help prevent the vortex formation during substrate transfer between the transfer chamber 130 and one or more of the processing chambers 112, 114, 116, and 118, diffusers 200 are fit into gas inlet ports 136 such that the purge gas is introduced into the transfer chamber 130 through the diffusers 200. The diffusers 200 are configured to spread the incoming gas over a wider area in the transfer chamber 130, thereby producing a more uniform gas flow than without the diffusers 200. The diffusers 200 in the transfer chamber 130 thus helps to prevent the vortex formation as the purge gas flows through the openings 152 at the boundaries of the transfer chamber 130 and the processing chambers 112, 114, 116, and 118. The diffusers 200 also raise the pressure in the transfer chamber 130 more uniformly than without diffusers 200. The increased pressure difference between the transfer chamber 130 and the processing chambers 112, 114, 116, and 118 helps to force the floating particle contaminants back into the processing chambers 112, 114, 116, and 118. As a result, defects caused by the particle contaminants precipitated on the substrates during the substrate transfer are prevented and/or minimized. Furthermore, because the substrates are heated during the dielectric CVD deposition, the uniform gas flow helps to cool the heated substrates in a uniform manner as the heated substrates are transferred out of the processing chambers 112, 114, 116 and 118 after dielectric deposition. As a result, the thermal stress on substrates caused by non-uniform cooling is reduced.

Figure 2:
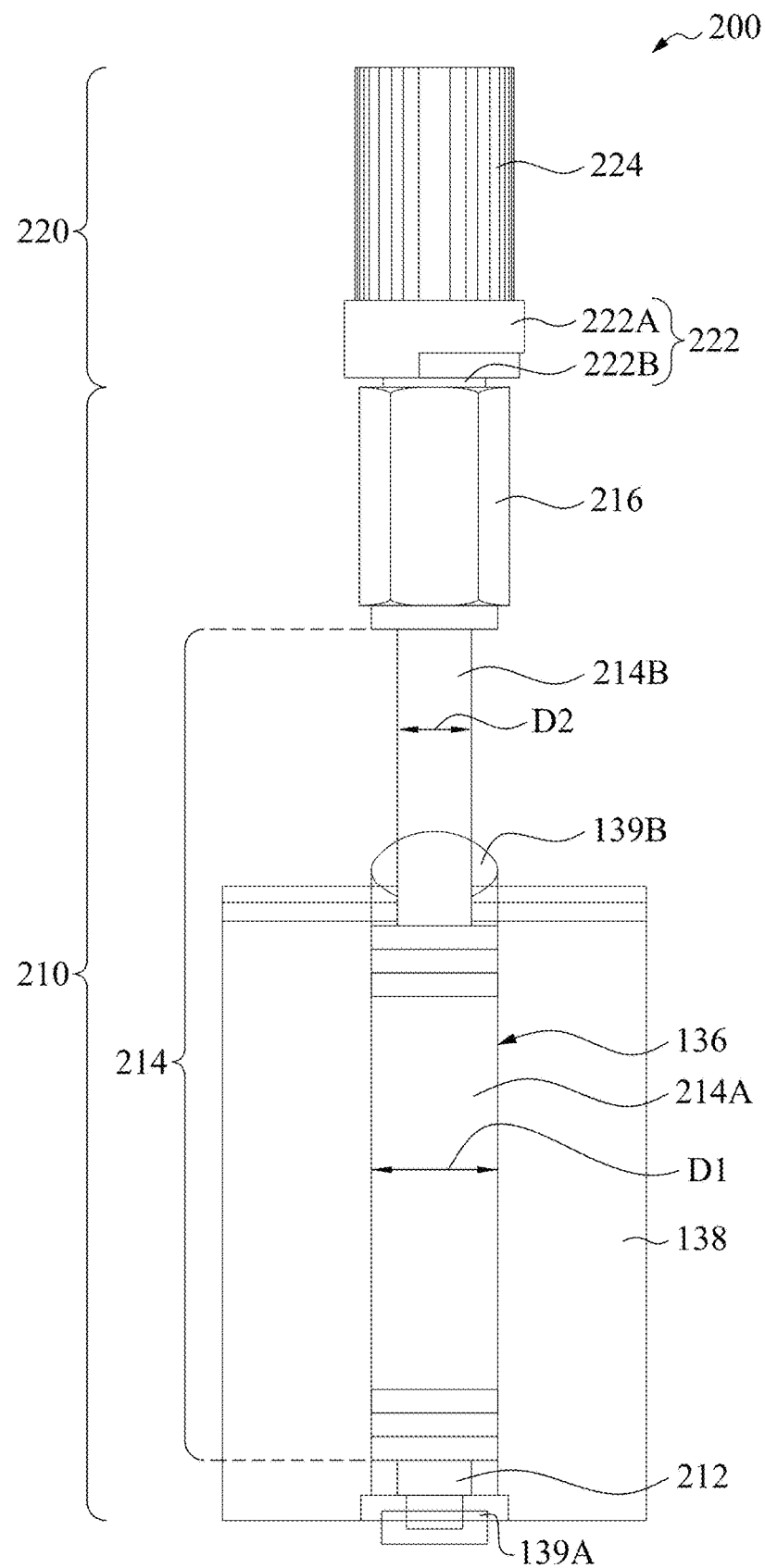
FIG. 2 is a perspective view of a diffuser assembly, in accordance with some embodiments.
Figure 3:
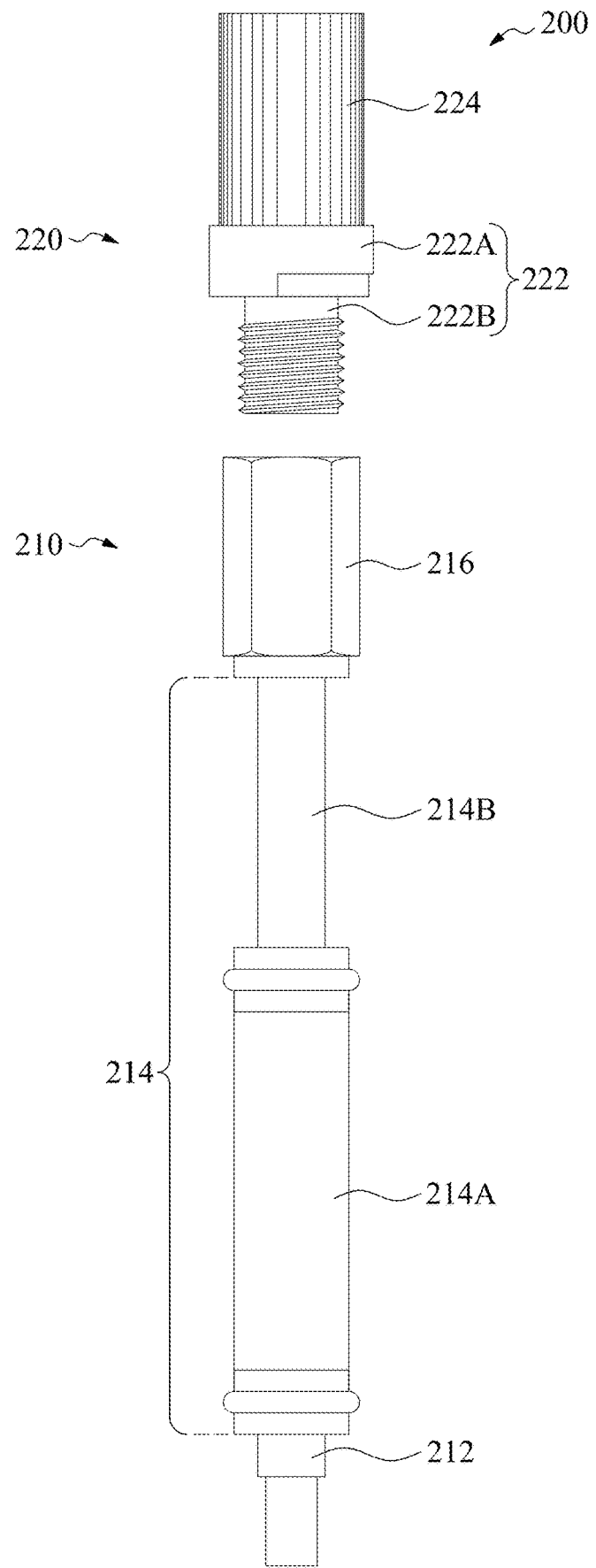
FIG. 3 is an exploded view of the diffuser assembly of FIG. 2.

FIG. 2 is a perspective view of the diffuser 200, in accordance with some embodiments. FIG. 3 is an exploded view of the diffuser 200. The diffuser 200 is removably fitted into the gas inlet port 136 so that the diffuser 200 is able to receive purge gas from the gas supply system 160 and direct the purge gas into the interior of the transfer chamber 130 (FIG. 1). Referring to FIGS. 2 and 3, the diffuser 200 includes a base portion 210 and a head portion 220 mountable on the base portion 210.

The base portion 210 defines a gas passage through which the purge gas from the gas supply system 160 flows into the head portion 220 of the diffuser 200. In some embodiments, the base portion 210 includes a neck portion 212, a body portion 214 upstream of the neck portion 212, and a fitting element 216 attached to an upper end of the body portion 214.

In some embodiments, the neck portion 212 is a hollow cylinder configured to fluidly couple the diffuser 200 to an inlet nozzle 139A (FIG. 1) at the bottom of the gas inlet port 136. In some embodiments, the neck portion 212 has a smaller dimension, e.g., diameter, than a portion of the body portion 214 directly adjoined the neck portion 212, i.e., first body portion 214A. In some embodiments, the neck portion 212 has a substantially constant dimension throughout a length of the neck portion 212. In some embodiments, the neck portion 212 is tapered with a gradually reduced dimension as the neck portion 212 extends away from the body portion 214. In some embodiments, the neck portion 212 includes stainless steel, aluminum, or nickel.

The body portion 214 is in fluid communication with the neck portion 212. In some embodiments, the body portion 214 includes a first body portion 214A and a second body portion 214B positioned upstream of the first body portion 214A. In some embodiments, the first body portion 214A has a dimension D1 configured to permit the first body portion 214A to fit within the gas inlet port 136. In some embodiments, the second body portion 214B has a dimension D2 configured to allow the second body portion 214B to pass through an opening 139B at the floor of the transfer chamber 130 such that the second body portion 214B is projected into the interior of the transfer chamber 130 through the opening 139B. In some embodiments, the dimension D2 of the second body portion 214B is the same as the dimension D1 of the first body portion 214A. In some embodiments, the dimension D2 of the second body portion 214B is different from the dimension D1 of the first body portion 214A. For example, in some embodiments, the dimension D1 of the first body portion 214A is configured to be greater than the dimension D2 of the second body portion 214B so as to allow a larger amount of purge gas passing through the diffuser 200 for fast purging of transfer chamber 130. In some embodiments, the body portion 214 includes stainless steel, aluminum, or nickel.

The fitting element 216 is configured to join the base portion 210 of the diffuser 200 to the head portion 220 of the diffuser 200. In some embodiments, the fitting element 216 is a nut shaped to mate with a connecting structure 222 (described below) situated on the head portion 220.

In some embodiments, the head portion 220 includes a connecting structure 222 and a diffusion element 224 upstream of the connecting structure 222.

The connecting structure 222 is configured to couple the diffusion element 224 to the fitting element 216 of the base portion 210. The connecting structure 222 has a hollow interior such that after the head portion 220 is assembled to the base portion 210 through the connecting structure 222, the head portion 220 is in fluid communication with the base portion 210. In some embodiments, the connecting structure 222 includes a first connecting portion 222A configured to receive a bottom portion of the diffuser element 224 and a second connecting portion 222B configured to mate with the fitting element 216. In some embodiments, the second connecting portion 222B of the connecting structure 222 protrudes outwardly from first connecting portion 222A of the connecting structure 222 and has a dimension less than a dimension of the first connecting portion 222A of the connecting structure 222. In some embodiments, the first connecting portion 222A and the second connecting portion 222B of the connecting structure 222 indecently have a cylindrical structure. In some embodiments, when the fitting element 216 is a nut, the second connecting portion 222B includes a hollow bolt having a threaded portion configured to mate with the nut. In some embodiments, the connecting structure 222 includes stainless steel, aluminum or nickel.

The diffuser element 224 is configured to allow only a first fraction of the purge gas entering the diffuser 200 to diffuse into the interior of the transfer chamber 130 through the top of the diffuser element 224, while allowing a second fraction of the purge gas to diffuse radially through a circumference of the diffuser element 224 into the interior of the transfer chamber 130. In some embodiments, the first fraction is less than the second fraction. The diffuser 200 thereby helps to improve gas flow uniformity in the transfer chamber 130 by radially dispersing the purge gas. As a result, chances of formation of turbulence gas pattern (i.e., vortex) which disturbs particles and contaminates substrates when the substrates are transferred in and out of the transfer chamber 130 are reduced. In some embodiments, the diffuser element 224 is comprised of a porous material that allows passage of the purge gas. Exemplary porous materials include, but are not limited to, stainless steel, nylon, polyester, polyethylene, and ceramic materials. In some embodiments, the diffuser element 224 is formed of intermeshed or woven stainless steel wool. In some embodiments, the porous material is provided with pores in a size ranging from about 0.1 micron (μm) to about 50 μm. If the size of the pore is too great, gas diffuses rapidly from pores closes to the bottom of the diffuser element 224, a non-uniform gas diffusion is likely to occur, in some instances. If the size of the pore is too small, the gas permeability is too low, time required to purging the transfer chamber is thus prolonged, resulting in low system throughput, in some embodiments. The diffuser element 224 may be formed in any shape, as long as after the purge gas flows out of the diffuser element 224, a substantially uniform distribution of gas flow is achieved. In some embodiments, the diffuser element 224 has a cylindrical shape. The size of the diffuser element 224 is configured such that the diffuser element 224 does not impede the movement of the robot blades 134. In some embodiments, the diffuser element 224 has a diameter ranging from about 15 mm to about 35 mm, and a height ranging from about 20 mm to about 50 mm. If the size of the diffuser element 224 is too great, the risk of impeding the movement of the robot blade 134 increases, in some instances. If the size of the diffuser element 224 is too small, the amount of the purge gas passing through the diffuser element 224 and into the transfer chamber 130 becomes too small, resulting in low purging efficiency, in some instances.

Although the diffuser 200 is formed by assembling two pieces, i.e., the base portion 210 and the head portion 220, one of ordinary skill in the art would understand that in some embodiments, the base portion 210 and the head portion 220 are formed as a single piece structure as opposed to the assembled structure.

The flow rate of the purge gas through the diffuser 200 is regulated by valve 168 (FIG. 1). The flow rate is controlled to help prevent the formation of vortex when a substrate passes through openings 152 into or out of processing chambers 112, 114, 116, and 118. In some embodiments, the flow rate of the purge gas through the diffuser 200 is maintained between about 700 standard cubic centimeters per minute (sccm) and about 4500 sccm. If the flow rate of the purge gas is too low, the purging efficiency is low which adversely affects the system throughput, in some instances. If the flow rate of the purge gas is too high, the vortex flow is induced which increases the likelihood of particulate contamination, in some instances.

Figure 4:
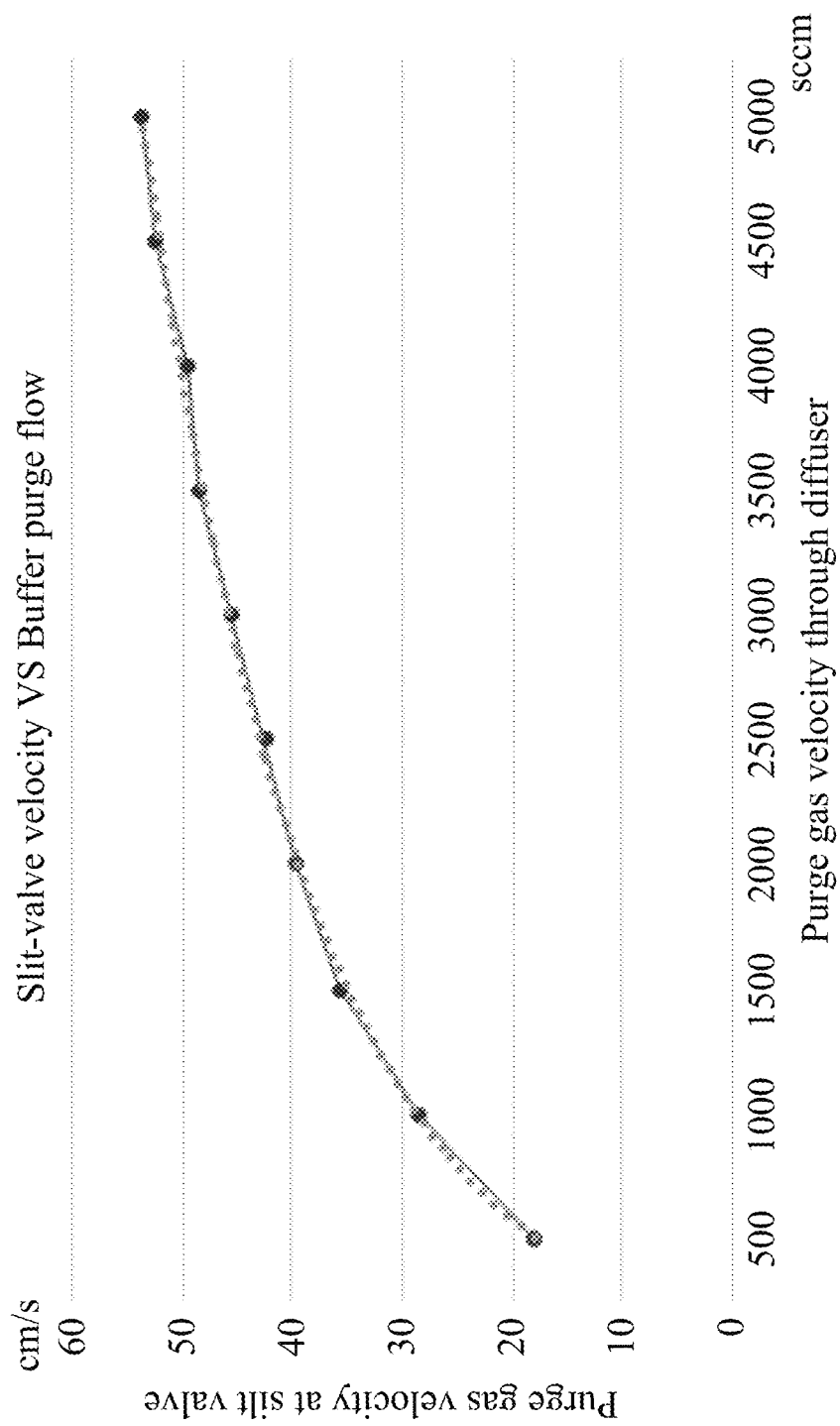
FIG. 4 is a graph of a relationship between a velocity of a purge gas through a diffuser and a velocity of the purge gas at a slit valve, in accordance with some embodiments.

FIG. 4 is a graph of a relationship between the velocity of the purge gas through the diffuser and the velocity of the purge gas at the slit valve, in accordance with some embodiments. The velocity of the purge gas at the slit valve continues to increase as the velocity of the purge gas through the diffuser increases, and the velocity of the purge gas at the slit valve tends to reach a saturation point when the velocity of the purge gas through the diffuser is about 4500 sccm. That is, when the velocity of the purge gas through the diffuser is above 4500 sccm, further increasing the velocity of purge gas through the diffuser only results in a slight increase in the velocity of the purge gas at the slit valve. In comparison with the transfer chamber with no diffuser installed, the diffuser 200 allows purge gas flowing at higher velocity without formation of the vortex, and thus helps to reduce particulate contamination and prevent local cooling, and at the same time improve system throughput. FIG. 4 further indicates that the experimental data fits well with the simulation results. The simulation results thus are useful in optimizing the purge gas flow rate when the diffuser 200 is employed to introduce a purge gas into the transfer chamber 130.

Figure 5:
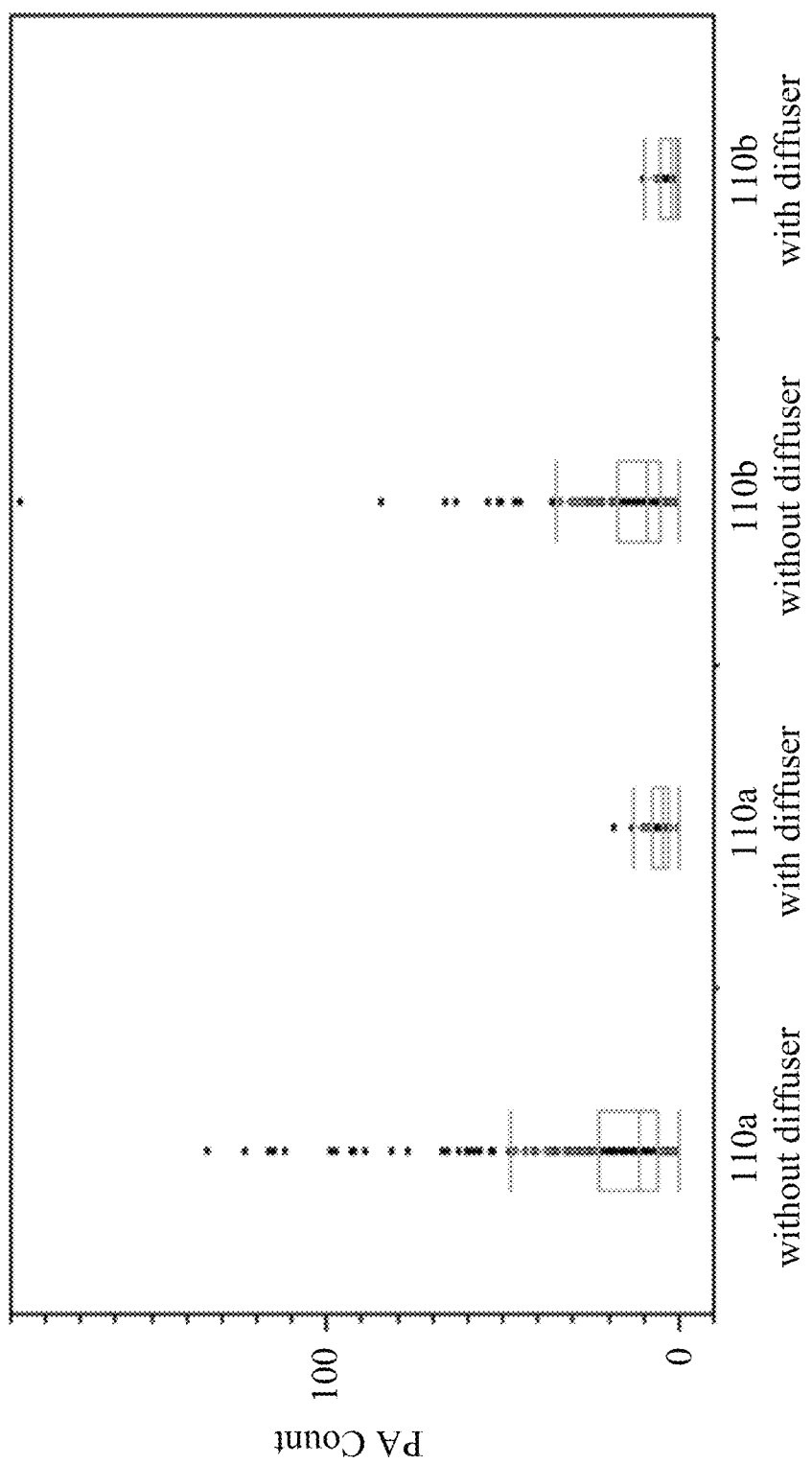
FIG. 5 is a graph of particle counts in respective tandem processing chambers with and without a diffuser, in accordance with some embodiments.

FIG. 5 is a graph of particle counts in tandem processing chambers 110a and 110b with or without the use of diffusers 200 in transfer chamber 130, in accordance with some embodiments. Introducing a purge gas into the transfer chamber 130 through diffusers 200 helps to prevent the vortex formation as the substrates pass through the openings of processing chambers 112 and 114, 116 and 118 in corresponding tandem processing chambers 110a and 110b. The resulting uniform gas flow prevents the particle contaminants from being deposited on the substrate surfaces. As a result, the particle counts in each tandem processing chambers 110a, 110b is reduced when diffusers 200 are used to regulate the gas flow for the tandem processing chambers 110a, 110b.

In some of the embodiments described above, by equipping transfer chamber 130 of a semiconductor processing system 100 with diffusers 200 to provide a uniform gas flow in the transfer chamber 130, particle contaminants within the processing chambers 112, 114, 116, 118 and on the slit valves 154 are less likely to be stirred, and then deposited, onto the substrates during substrate transfer. The diffusers thus help to increase wafer yield and the throughput of the semiconductor processing system. The embodiments described herein are especially useful for formation of porous low-k dielectrics where porogen residues, known as a major source of particle contaminants, are present. One of ordinary sill in the art would understand that the diffuser 200 is advantageously employed to provide uniform gas flow for tandem chamber arrangement as well as for single chamber arrangement.

FIG. 6 is a flow chart of a method 600 of controlling a gas flow distribution profile in a transfer chamber 130, in accordance with some embodiments. The description of method 600 uses the semiconductor processing system 100 described with respect to FIGS. 1-3. In some embodiments, additional processes are performed before, during, and/or after the method 600 in FIG. 6, and some of the processes described herein are replaced or eliminated in some embodiments.

In operation 602, a semiconductor processing system 100 is provided. The semiconductor processing system 100 includes a transfer chamber 130 and a plurality of tandem processing chambers 110a and 110b connected to the transfer chamber 130. The transfer chamber 130 contains a plurality of gas inlet ports 136 located between adjacent processing chambers 112 and 114, 116 and 118 of respective tandem processing chambers 110a, 110b. Diffusers 200 each include a diffuser element made of a cylindrical shaped porous material to provide a uniform gas flow.

In operation 604, a plurality of substrates is transferred into the transfer chamber 130.

In operation 606, the transfer chamber 130 is purged by inflow of a purge gas through respective diffusers 200. The flow rate of the purge gas through each diffuser 200 is controlled such that a substantially uniform gas flow is provided after the purge gas flows into the interior of the transfer chamber 130 through each diffuser 200. In some embodiments, the flow rate of the purge gas through the diffuser 200 is maintained between about 700 sccm and about 4500 sccm.

In operation 608, slit valves 154 between the transfer chamber 130 and the processing chambers 112 and 114 or 116 and 118 in each tandem processing chambers 110a, 110b are opened.

In operation 610, substrates are transferred into the processing chambers 112 and 114, 116 and 118 with the purge gas continuously flowing into the transfer chamber 130.

In operation 612, slit valves 154 are closed and valves 168 of the gas supply system 160 are closed to stop the gas flow.

FIG. 7 is a schematic diagram of a controller system 700, in accordance with one or more embodiments. The controller system 700 generates output control signals for controlling operation of one or more components of semiconductor processing system 100, in accordance with some embodiments. The controller system 700 receives input signals from one or more components of the semiconductor processing system 100, in accordance with some embodiments. In some embodiments, the controller system 700 is located adjacent semiconductor processing system 100. In some embodiments, the controller system 700 is remote from the semiconductor processing system 100.

The controller system 700 includes a processor 702, an input/output (I/O) interface 704, a memory 706, and a network interface 708 each communicatively coupled via a bus 710 or other interconnection communication mechanism.

The processor 702 is arranged to execute and/or interpret one or more set of instructions 712 stored in the memory 706. In some embodiments, the processor 702 is a central processing unit (CPU), a multi-processor, a distributed processing system, an application specific integrated circuit (ASIC), and/or a suitable processing unit.

The I/O interface 704 is coupled to external circuitry. In some embodiments, the I/O interface 704 includes a keyboard, keypad, mouse, trackball, trackpad, and/or cursor direction keys for communicating information and commands to the processor 702.

The memory 706 (also referred to as a computer-readable medium) includes a random access memory or other dynamic storage device, communicatively coupled to the bus 710 for storing data and/or instructions for execution by the processor 702. In some embodiments, the memory 706 is used for storing temporary variables or other intermediate information during execution of instructions to be executed by the processor 702. In some embodiments, the memory 706 also includes a read-only memory or other static storage device coupled to the bus 710 for storing static information and instructions for the processor 702. In some embodiments, the memory 706 is an electronic, magnetic, optical, electromagnetic, infrared, and/or a semiconductor system (or apparatus or device). For example, the memory 706 includes a semiconductor or solid-state memory, a magnetic tape, a removable computer diskette, a random access memory (RAM), a read-only memory (ROM), a rigid magnetic disk, and/or an optical disk. In some embodiments using optical disks, the memory 706 includes a compact disk-read only memory (CD-ROM), a compact disk-read/write (CD-R/W), and/or a digital video disc (DVD).

The memory 706 is encoded with, i.e., storing, the computer program code, i.e., a set of executable instructions 712, for controlling one or more components of the semiconductor processing system 100 and causing the controller system 700 to perform the method 600. In some embodiments, the memory 706 also stores information needed for performing the method 600 as well as information generated during performing the method 600.

The network interface 708 includes a mechanism for connecting to a network 709, to which one or more other computer systems are connected. In some embodiments, the network interface 708 includes a wired and/or wireless connection mechanism. The network interface 708 includes wireless network interfaces such as BLUETOOTH, WIFI, WIMAX, GPRS, or WCDMA; or wired network interface such as ETHERNET, USB, or IEEE-1394. In some embodiments, the controller system 700 is coupled with one or more components of the semiconductor processing system 100 via the network interface 708. In some embodiments, the controller system 700 is directly coupled with one or more components of the semiconductor processing system 100, e.g., with the components coupled to the bus 710 instead of via the network interface 708.

One aspect of this description relates to a diffuser for diffusing a gas. The diffuser includes a base portion and a head portion fluidly coupled to the base portion. The head portion includes a diffuser element configured to diffuse a first fraction of the gas through a circumference of the diffuser element and a second fraction of the gas through an end surface of the diffuser element. The head portion further includes a connecting structure having a first connecting portion configured to receive a portion of the diffuser element therein and a second connecting portion protruding outwardly from the first connecting portion and configured to couple to the base portion. In some embodiments, the first connecting portion has a dimension greater than a dimension of the second connecting portion. In some embodiments, the second connecting portion includes a hollow bolt having a threaded portion. In some embodiments, the base portion includes a fitting element configured to mate with the second connecting portion of the connecting structure. In some embodiments, the fitting element includes a nut. In some embodiments, the base portion further includes a neck portion and a body portion having a first end fluidly coupled to the neck portion and a second end fluidly coupled to the fitting element. The second end is opposite the first end. In some embodiments, the body portion includes a first body portion fluidly coupled to the neck portion and a second body portion fluidly coupled to the fitting element. The first body portion has a dimension greater than a dimension of the second body portion. In some embodiments, the diffuser element has a cylindrical shape. In some embodiments, the diffuser element includes a porous material. In some embodiments, the first fraction of the gas is greater than the second fraction of the gas.

Another aspect of this description relates to a semiconductor processing system. The system includes a transfer chamber including at least one gas inlet port through a wall of the transfer chamber. The system further includes a tandem processing chamber connected to the transfer chamber. The tandem processing chamber includes a first processing chamber and a second processing chamber. The system further includes a diffuser adapted to fit into the at least one gas inlet port and protrude into an interior of the transfer chamber. The diffuser includes a base portion and a head portion fluidly coupled to the based portion. The head portion includes a diffuser element configured to diffuse a purge gas substantially uniformly into the interior of the transfer chamber. The head portion further includes a connecting structure including a first connecting portion configured to receive a portion of the diffuser element therein, and a second connecting portion protruding outwardly from the first connecting portion and configured to couple to the base portion. In some embodiments, the diffuser element has a cylindrical shape. In some embodiments, the diffuser element includes a porous material including stainless steel, nylon, polyester, polyethylene, or a ceramic material. In some embodiments, the diffuser element includes a porous material having a pore size ranging from 0.1 micron ($\mu$m) to about 50 $\mu$m. In some embodiments, the base portion includes a neck portion, a body portion fluidly coupled to the neck portion, and a fitting element attached to an end of the body portion. The fitting element is configured to mate with the second connecting portion of the connecting structure. In some embodiments, the body portion includes a first body portion configured to be received in the at least one gas inlet port and a second body portion configured to protrude into the interior of the transfer chamber. In some embodiments, the system further includes a first opening at a boundary between the transfer chamber and the first processing chamber and a second opening at a boundary between the transfer chamber and the second processing chamber. In some embodiments, the system further includes a first slit valve adapted to open and close the first opening; and a second slit valve adapted to open and close the second opening.

Still another aspect of this description relates to a semiconductor processing system. The system includes a transfer chamber having a plurality of gas inlet ports extending through a wall of the transfer chamber. The system further includes a plurality of processing chambers connected to the transfer chamber. The system further includes a diffuser adapted to fit into to a corresponding gas inlet port of the plurality of the gas inlet ports. The diffuser includes a base portion having a neck portion, a body portion fluidly coupled to the neck portion, and a fitting element coupled to the body portion. The diffuser further includes a head portion fluidly coupled to the based portion. The head portion includes a diffuser element configured to diffuse a purge gas substantially uniformly into an interior of the transfer chamber. The heard portion further includes a connecting structure including a first connecting portion configured to receive a portion of the diffuser element therein and a second connecting portion protruding outwardly from the first connecting portion and configured to mate with the fitting element. In some embodiments, the diffuser element has a cylindrical shape configured to diffuse a first fraction of the purge gas through a circumference of the diffuser element and a second fraction of the purge gas through an end surface of the diffuser element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor processing system, comprising:
   a transfer chamber, wherein the transfer chamber comprises at least one gas inlet port through a wall of the transfer chamber;
   a tandem processing chamber connected to the transfer chamber, wherein the tandem processing chamber comprises a first processing chamber and a second processing chamber, and each of the first processing chamber and the second processing chamber is configured to receive a wafer directly from the transfer chamber; and
   a diffuser adapted to fit into the at least one gas inlet port and protrude into an interior of the transfer chamber, wherein the diffuser comprises:
      a base portion, wherein the base portion comprises:
         a neck portion;
         a body portion in fluid connection with the neck portion; and
         a fitting element attached to an end of the body portion, wherein the fitting element is configured to mate with a second connecting portion of the connecting structure; and
      a head portion in fluid connection with the base portion, wherein the head portion comprises:
         a diffuser element configured to diffuse a purge gas uniformly into the interior of the transfer chamber, and
         a connecting structure comprising a first connecting portion configured to receive a portion of the diffuser element therein, and the second connecting portion protruding outwardly from the first connecting portion and configured to couple to the base portion.

2. The diffuser of claim 1, wherein the first connecting portion has a dimension greater than a corresponding dimension of the second connecting portion.

3. The diffuser of claim 1, wherein the second connecting portion comprises a hollow bolt having a threaded portion.

4. The diffuser of claim 1, wherein the fitting element comprises a nut.

5. The system of claim 1, wherein the diffuser element has a cylindrical shape.

6. The system of claim 1, wherein the diffuser element comprises a porous material comprising stainless steel, nylon, polyester, polyethylene, or a ceramic material.

7. The system of claim 1, wherein the diffuser element comprises a porous material having a pore size ranging from 0.1 micron (μm) to 50 μm.

8. The system of claim 1, wherein the body portion comprises:
a first body portion configured to be received in the at least one gas inlet port; and
a second body portion configured to protrude into the interior of the transfer chamber.

9. The system of claim 1, further comprising:
a first opening at a boundary between the transfer chamber and the first processing chamber; and
a second opening at a boundary between the transfer chamber and the second processing chamber.

10. The system of claim 9, further comprising:
a first slit valve adapted to open and close the first opening; and
a second slit valve adapted to open and close the second opening.

11. The semiconductor processing system of claim 1, wherein the diffuser element comprises a porous material.

12. The semiconductor processing system of claim 1, wherein the diffuser element comprises a porous material having a pore size ranging from 0.1 micron (μm) to 50 μm.

13. A semiconductor processing system, comprising:
a transfer chamber, wherein the transfer chamber comprises a plurality of gas inlet ports extending through a wall of the transfer chamber;
a plurality of processing chambers connected to the transfer chamber;
a plurality of valves, wherein each valve of the plurality of valves separates a process chamber of the plurality of processing chambers from the transfer chamber, and a gas inlet port of the plurality of gas inlet port is between adjacent valves of the plurality of valves; and
a diffuser adapted to fit into the gas inlet port of the plurality of the gas inlet ports, wherein the diffuser element has a cylindrical shape configured to diffuse a first fraction of the purge gas through a circumference of the diffuser element and a second fraction of the purge gas through an end surface of the diffuser element, and the diffuser comprises:
a base portion comprising a neck portion, a body portion in fluid connection with the neck portion, and a fitting element coupled to the body portion; and
a head portion in fluid connection with the base portion, wherein the head portion comprises:
a diffuser element configured to diffuse a purge gas uniformly into an interior of the transfer chamber, and
a connecting structure comprising a first connecting portion configured to receive a portion of the diffuser element therein, and a second connecting portion protruding outwardly from the first connecting portion and configured to mate with the fitting element.

14. The diffuser of claim 13, wherein the body portion comprises: a first body portion in fluid connection with the neck portion; and a second body portion in fluid connection with the fitting element, wherein the first body portion has a dimension greater than a corresponding dimension of the second body portion.

15. The diffuser of claim 13, wherein the diffuser element has a cylindrical shape.

16. The semiconductor processing system of claim 13, wherein the diffuser element comprises a porous material.

17. The semiconductor processing system of claim 13, wherein the diffuser element comprises a porous material having a pore size ranging from 0.1 micron (μm) to 50 μm.

* * * * *